(12) United States Patent
Driemel

(10) Patent No.: US 9,134,389 B2
(45) Date of Patent: Sep. 15, 2015

(54) MR COIL WITH MOVABLE ANTENNA ELEMENTS

(75) Inventor: Daniel Driemel, Oederan (DE)

(73) Assignee: Siemens Aktiengsellschaft, München (DE)

( * ) Notice: Subject to any disclaimer, the term of this patent is extended or adjusted under 35 U.S.C. 154(b) by 933 days.

(21) Appl. No.: 13/160,300

(22) Filed: Jun. 14, 2011

(65) Prior Publication Data

US 2012/0153956 A1    Jun. 21, 2012

(30) Foreign Application Priority Data

Jun. 15, 2010    (DE) .......................... 10 2010 023 845

(51) Int. Cl.
*G01R 33/3415* (2006.01)
*G01R 33/34* (2006.01)

(52) U.S. Cl.
CPC .... *G01R 33/34084* (2013.01); *G01R 33/34007* (2013.01); *G01R 33/3415* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 5,361,765 A * | 11/1994 | Herlihy et al. | ................. | 600/422 |
| 6,011,393 A * | 1/2000 | Kaufman et al. | ............. | 324/318 |
| 6,037,773 A | 3/2000 | Mitsumata et al. | ........... | 324/318 |
| 6,137,291 A * | 10/2000 | Szumowski et al. | ........... | 324/318 |
| 6,577,888 B1 | 6/2003 | Chan et al. | ..................... | 600/422 |
| 6,591,128 B1 * | 7/2003 | Wu et al. | ........................ | 600/422 |
| 6,750,653 B1 * | 6/2004 | Zou et al. | ........................ | 324/318 |
| 6,788,057 B1 * | 9/2004 | Petropoulos et al. | ......... | 324/318 |
| 6,980,002 B1 * | 12/2005 | Petropoulos et al. | ......... | 324/318 |
| 7,394,256 B2 * | 7/2008 | Schubert et al. | ............... | 324/321 |
| 7,619,412 B2 * | 11/2009 | Okamoto et al. | ............... | 324/318 |
| 7,884,607 B2 * | 2/2011 | Kundner et al. | ............... | 324/318 |
| 7,906,966 B1 * | 3/2011 | Votruba | ........................ | 324/318 |
| 8,638,100 B2 * | 1/2014 | Driemel | ........................ | 324/318 |
| 2006/0267588 A1 * | 11/2006 | Okamoto et al. | ............... | 324/318 |
| 2007/0152667 A1 * | 7/2007 | Schubert et al. | ............... | 324/318 |
| 2011/0040174 A1 * | 2/2011 | Driemel | ........................ | 600/422 |
| 2012/0153956 A1 * | 6/2012 | Driemel | ........................ | 324/322 |
| 2012/0256633 A1 * | 10/2012 | Biber et al. | ................... | 324/322 |

FOREIGN PATENT DOCUMENTS

| | | |
|---|---|---|
| DE | 103 14 215 B4 | 11/2006 |
| DE | 10 2006 027 190 A1 | 12/2007 |
| DE | 10 2006 050 104 A1 | 5/2008 |

OTHER PUBLICATIONS

German Office Action dated Mar. 14, 2011 for corresponding German Patent Application No. DE 10 2010 023 845.7-54 with English translation.

* cited by examiner

*Primary Examiner* — Melissa Koval
*Assistant Examiner* — Tiffany Fetzner
(74) *Attorney, Agent, or Firm* — Lempia Summerfield Katz LLC

(57) ABSTRACT

The present embodiments relate to a local coil for a magnetic resonance tomography system. The local coil includes at least one coil element having an antenna. The at least one coil element is movable relative to a housing of the local coil.

28 Claims, 4 Drawing Sheets

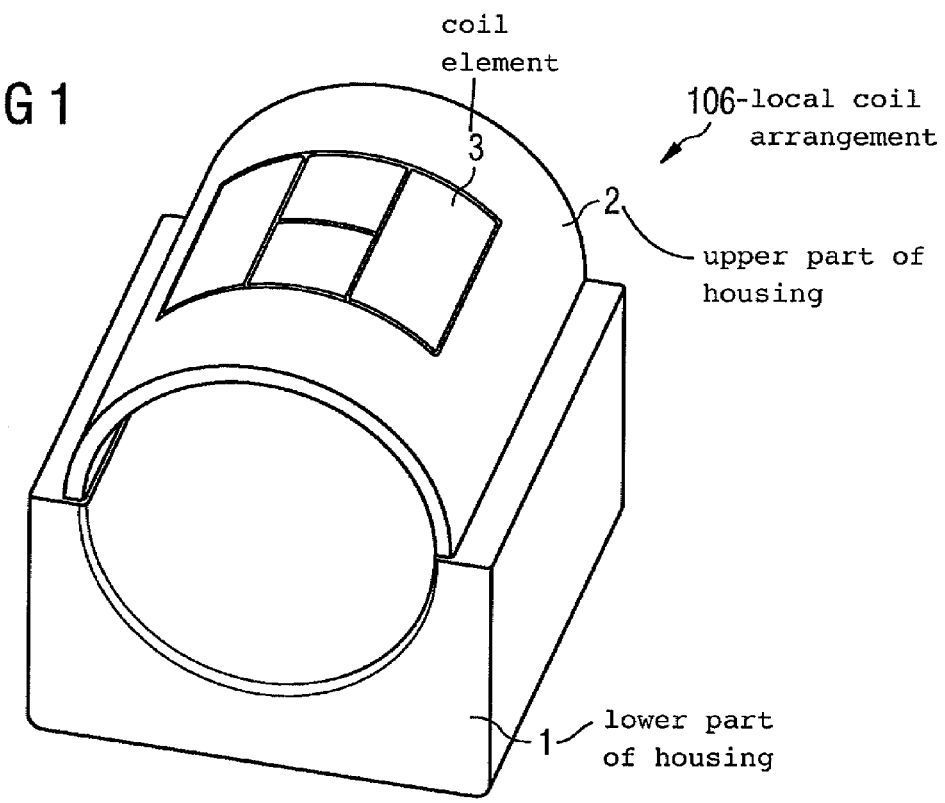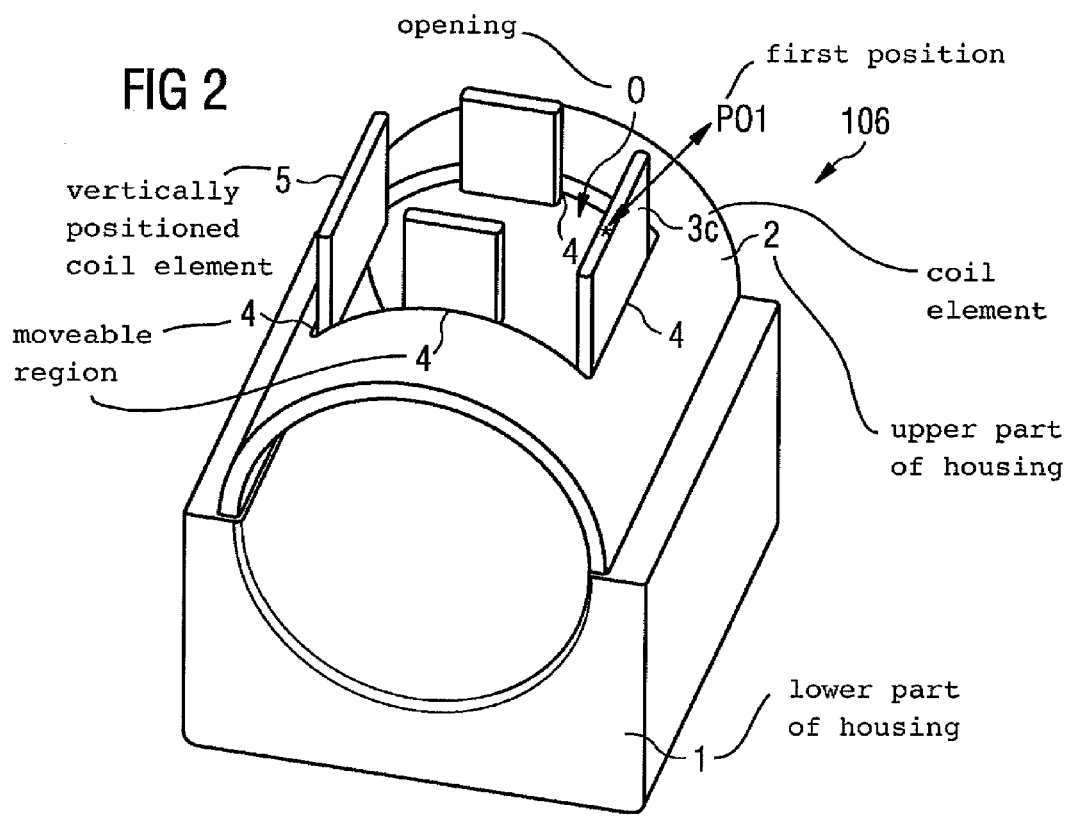

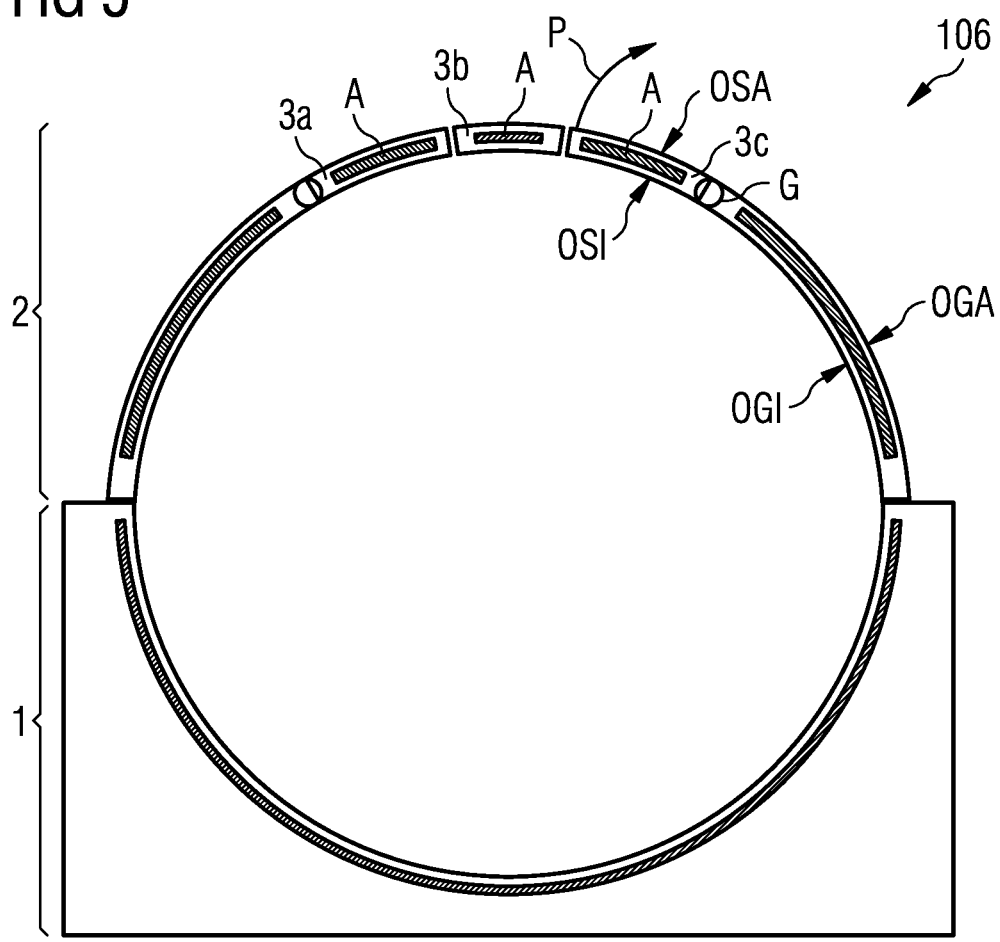

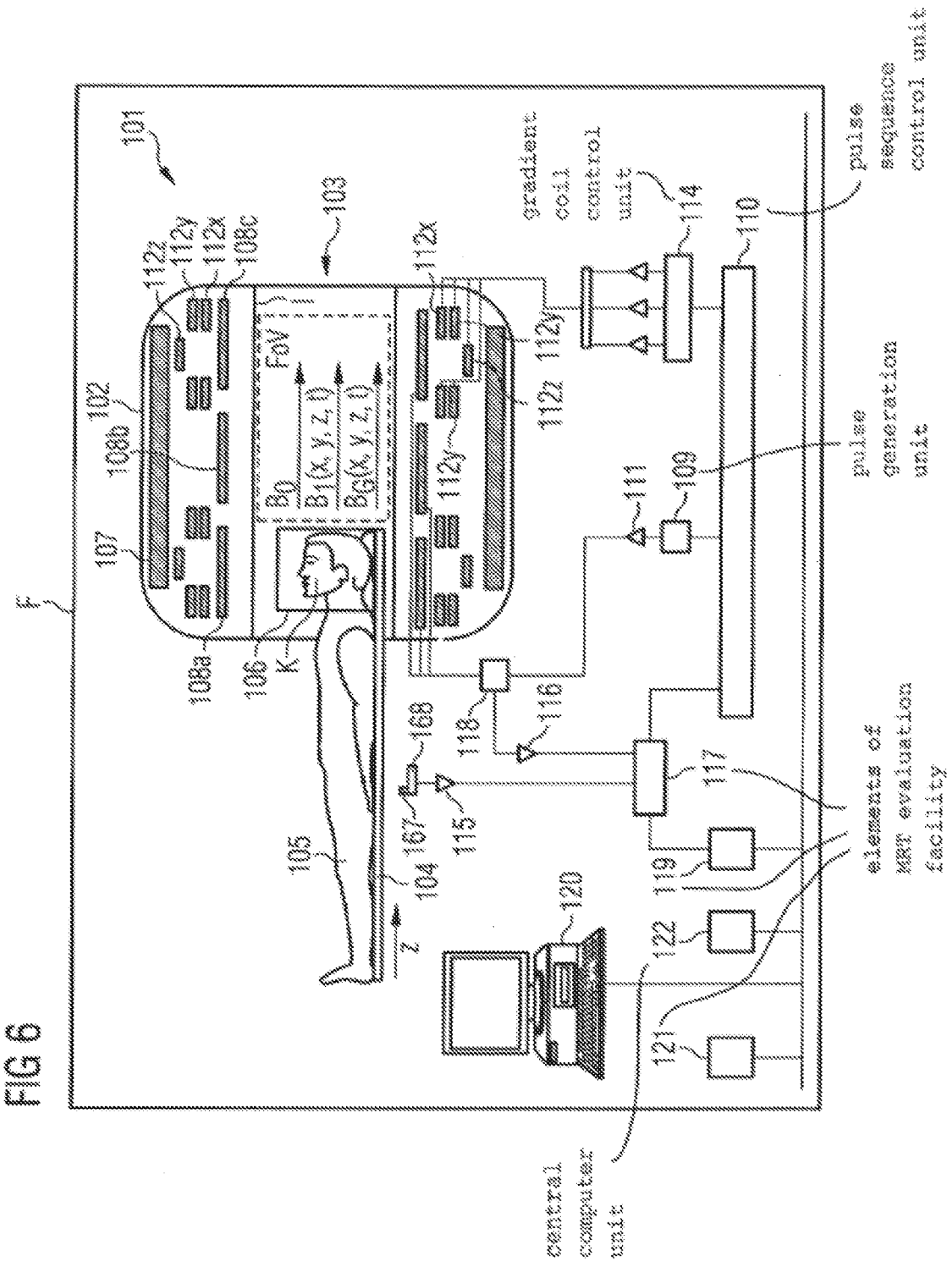

MR COIL WITH MOVABLE ANTENNA ELEMENTS

This application claims the benefit of DE 10 2010 023 845.7, filed Jun. 15, 2010.

BACKGROUND

The present embodiments relate to a magnetic resonance tomography (MRT) local coil for an MRT system.

MRT devices for examining objects or patients using magnetic resonance tomography (MRT, MRI) are known, for example, from DE10314215B4.

In MRT, images with a high signal-to-noise ratio may be recorded using local coils or loops. In this process, the excited nuclei induce a voltage in the local coil. The induced voltage is amplified using a low-noise preamplifier (LNA) and forwarded to the electronic receive system by cable at MR frequency. To improve the signal-to-noise ratio, even with high-resolution images, high field systems (e.g., having a basic field strength of 3 Tesla or more) are used. If more coil elements or loops are to be connected to the MR receive system than there are receivers present, a switching matrix (e.g., RCCS) is introduced between receive antennas and receivers. This routes the currently active receive channels to the receivers present. This allows more coil elements to be connected than there are receivers present. For whole body coverage, only the coils located in the field of view (FoV) or in a homogeneity volume of the magnet may be read out. The individual antenna elements are also referred to as coil elements in the following. A "coil" may include one or more coil elements (e.g., an array coil). The local coil includes coil elements, a preamplifier, further electronic units (e.g., down converter or digitization) and cabling, and a housing and may include a cable with plug (or a radio connection) to connect the local coil to the system.

SUMMARY AND DESCRIPTION

The present embodiments may obviate one or more of the drawbacks or limitations in the related art. For example, magnetic resonance tomography local coils for an MRT system may be optimized.

Such a configuration of an MRT local coil represents a fundamentally alternative structure from a design point of view. For example, a part (e.g., a knee) of an examination object may be pushed into or through a clear opening (e.g., a through opening), and/or a part of an examination object (e.g., a knee) may be seen from outside through an opening (e.g., as would also be possible in partially transparent local coil housings or through openings in local coil housings). A large number of coils may be used with a suitable embodiment.

BRIEF DESCRIPTION OF THE DRAWINGS

FIG. 1 shows a schematic diagram of one embodiment of an MRT local coil;

FIG. 2 shows a schematic diagram of one embodiment of an MRT local coil;

FIG. 5 shows a cross-sectional view of one embodiment of an MRT local coil; and

FIG. 6 shows a schematic diagram of an MRT system.

DETAILED DESCRIPTION OF THE DRAWINGS

Figure 3:
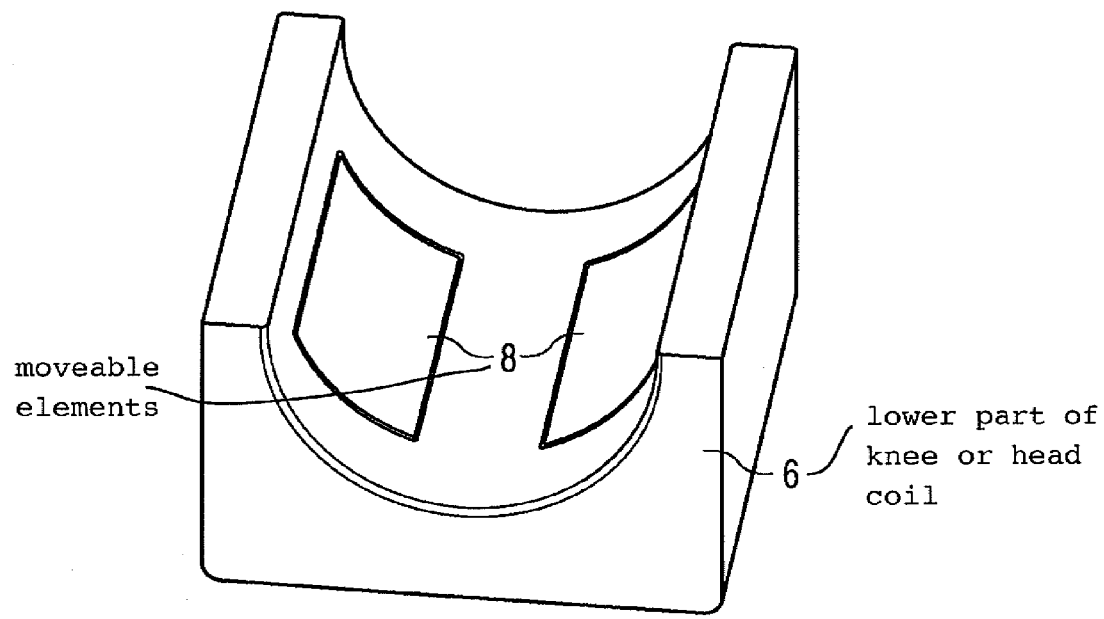
FIG. 3 shows a schematic diagram of a lower part of a housing of one embodiment of an MRT local coil.

FIG. 6 shows a magnetic resonance imaging device MRT 101 (e.g., present in a shielded room or Faraday cage F) with a whole body coil 102 having, for example, a tubular space 103. A patient couch 104 holding a body 105 (e.g., an examination object of a patient with or without a local coil arrangement 106) may be conveyed in the direction of the arrow z into the tubular space 103, in order to generate recordings of the patient 105 using an imaging procedure. In FIG. 6, a local coil arrangement 106 that may be used to generate recordings in a local region (e.g., a field of view (FoV)) is positioned on the patient. Signals from the local coil arrangement 106 may be evaluated (e.g., converted to images, stored or displayed) by an evaluation facility (e.g., elements 115, 117, 119, 120, 121) of the MRT 101 that may be connected by way of coaxial cable or radio (167, 168), for example, to the local coil arrangement 106.

In order to use the magnetic resonance imaging device MRT 101 to examine the body 105 (e.g., an examination object or the patient) using magnetic resonance imaging, different magnetic fields, the temporal and spatial characteristics of which are closely matched, are radiated onto the body 105. A powerful magnet (e.g., a cryomagnet 107) in a measuring cabin with a tunnel-type opening 103, for example, produces a static powerful main magnetic field $B_0$ of, for example, 0.2 Tesla to 3 Tesla or more.

The body 105 to be examined is supported on a patient couch 104 and conveyed into a roughly homogeneous region of the main magnetic field B0 in the field of view FoV. Excitation of the nuclear spin of atomic nuclei in the body 105 takes place by way of magnetic high-frequency excitation pulses B1 (x, y, z, t). The magnetic high-frequency excitation pulses B1 (x, y, z, t) are radiated in by way of a high-frequency antenna (and/or a local coil arrangement), illustrated in FIG. 6 in a simplified manner as a body coil 108 (e.g., a high-frequency antenna or a multipart bodycoil 108a, 108b, 108c). High-frequency excitation pulses are generated, for example, by a pulse generation unit 109 that is controlled by a pulse sequence control unit 110. After amplification by a high-frequency amplifier 111, the generated high-frequency excitation pulses are routed to the high-frequency antenna 108. The high-frequency system shown in FIG. 6 is only outlined schematically. In other embodiments, more than one pulse generation unit 109, more than one high-frequency amplifier 111 and a plurality of high-frequency antennas 108a, b, c are deployed in the magnetic resonance imaging device MRT 101.

The magnetic resonance imaging device MRT 101 also includes gradient coils 112x, 112y, 112z, that may be used to radiate in magnetic gradient fields for selective layer excitation and local coding of a measurement signal during a measurement. The gradient coils 112x, 112y, 112z are controlled by a gradient coil control unit 114 that, like the pulse generation unit 109, is connected to the pulse sequence control unit 110.

Signals emitted by the excited nuclear spin (e.g., of the atomic nuclei in the examination object) are received by the body coil 108 and/or at least one local coil arrangement 106, amplified by assigned high-frequency preamplifiers 116 and further processed and digitized by a receive unit 117. The recorded measurement data is digitized and stored as complex numerical values in a k-space matrix. An associated MR image may be reconstructed from the value-populated k-space matrix using a multidimensional Fourier transformation.

In the case of a coil that may be operated both in transmit and receive mode (e.g., the body coil 108 or a local coil), correct signal routing is regulated by an upstream transmit/receive switch 118.

An image processing unit 119 uses the measurement data to generate an image that is displayed to a user by way of an operating console 120 and/or stored in a storage unit 121. A central computer unit 122 controls the individual system components.

In MR tomography, images with a high signal-to-noise ratio (SNR) may be recorded using local coil arrangements (e.g., coils, local coils). The local coil arrangements are antenna systems that are positioned in direct proximity to (anterior), below (posterior) or in the body. During an MR measurement, the excited nuclei induce a voltage in the individual antennas of the local coil. The induced voltage is amplified using a low-noise preamplifier (e.g., LNA, preamp) and forwarded to the electronic receive system. To improve the signal-to-noise ratio (e.g., even with high-resolution images), high field systems (e.g., 1.5 T and more) are used. If more individual antennas may be connected to an MR receive system than there are receivers present, a switching matrix (e.g., RCCS), for example, is introduced between receive antennas and receivers. This routes the currently active receive channels (e.g., the receive channels currently in the field of view FoV of the magnet) to the receivers present. This allows more coil elements to be connected than there are receivers present. For whole body coverage, the coils located in the FoV or in the homogeneity volume of the magnet are read out.

The local coil arrangement 106 may be an antenna system that may include, for example, one or a plurality (e.g., for an array coil) of antenna elements (e.g., coil elements). The individual antenna elements are configured, for example, as loop antennas (e.g., loops), butterfly coils, or saddle coils. The local coil arrangement 106 includes, for example, coil elements, a preamplifier, further electronic units (e.g., baluns), a housing, and supports and may include a cable with a plug to connect the local coil arrangement 106 to the MRT system. A receiver 168 on the system side filters and digitizes a signal received, for example, by radio from the local coil arrangement 106 and transmits the data to a digital signal processing system. The digital signal processing system may derive an image or spectrum from the data obtained by measurement and supplies the image or spectrum to the user for subsequent diagnosis and/or storage, for example.

Exemplary embodiments of MRT local coils are described in more detail below with reference to FIGS. 1-5.

Figure 4:
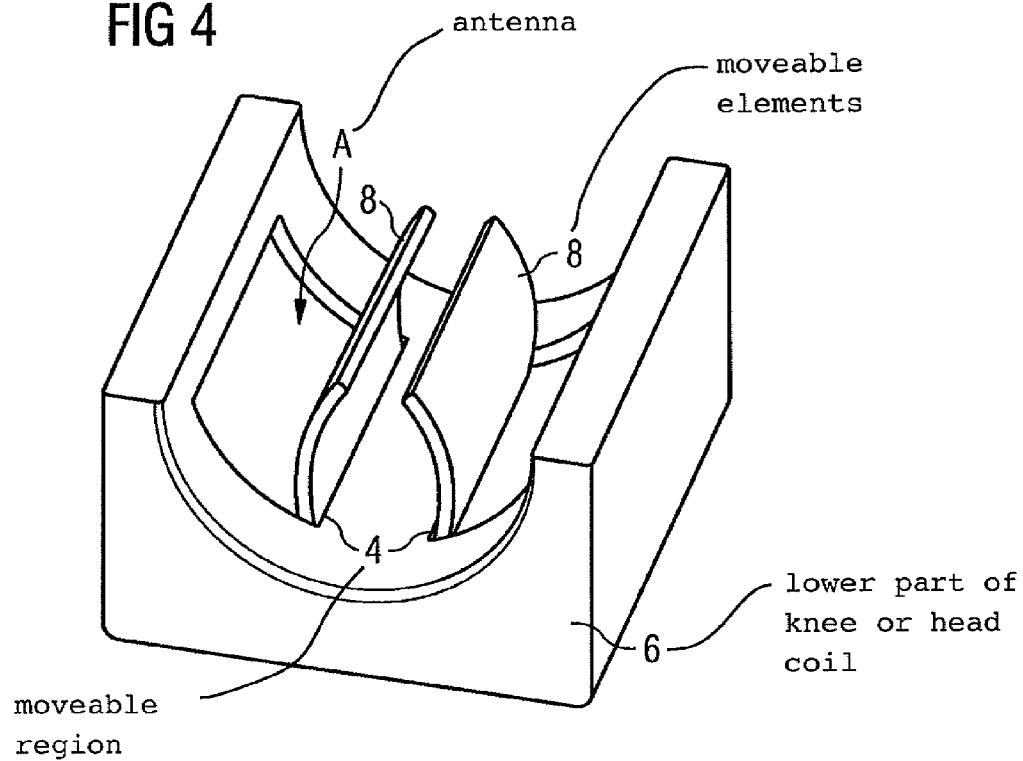
FIG. 4 shows a schematic diagram of a lower part of one embodiment of an MTR local coil.

FIGS. 1, 2, and 5 show schematic diagrams of embodiments of MRT local coils, and FIGS. 3 and 4 show schematic diagrams of lower parts of housings of embodiments of MRT local coils.

Individual coil elements (e.g., elements/parts of the local coil 106) of the local coil 106 (or local "overall antenna") are configured as movable relative to the remainder of the local coil 106 and/or a housing 1 and 2 of the local coil 106, such that movement of the individual coil elements may produce an opening (e.g., a window) in the local coil 106 or the housing 1 and 2 of the local coil 106. The individual coil elements may, for example, be disposed so that the coil elements may be folded using at least one articulation G on the local coil 106 and/or be disposed on the local coil 106 in a removable and/or attachable manner Additionally or alternatively, the coil elements may be configured in a pliable manner (e.g., in relation to the remainder of the local coil) as part of the local coil 106.

By moving, for example, one, two, three or four movable coil elements (e.g., movable parts 3, coil elements 3a-c; each coil element 3 including an antenna A) of the local coil 106 relative to the remainder of the housing 1 and/or 2 (or housing upper part and/or housing lower part) of the local coil 106, an opening O in the local coil 106 and/or in the housing 1 and/or 2 of the local coil 106 may be produced.

In a first position PO1 (e.g., shown in FIG. 2 with an asterisk "*") of at least one coil element 3c relative to the housing 1 and 2 of the local coil 106, the opening O in the housing 1 and 2 of the local coil 106 is provided. The opening O may not be present in a second position PO2 (e.g., shown in FIG. 1 with an asterisk "*") of the at least one coil element 3c relative to the housing 1 and 2 of the local coil 106 (e.g., the opening O is not present at least in this order or size, or is not present to the extent that a foot, a wrist, or another body part of the patient 105 cannot be moved into and/or through the opening O because the body part is larger in size than the remaining opening, while the foot, the wrist, or the another body part may be moved through the opening O in the first position PO1).

Partial regions of the local coil 106, complete receive elements 3 of the local coil 106 or a plurality of receive elements 3 of the local coil 106 may be moved. The embodiment may also be a function of the number of channels of the local coil 106.

The example in FIGS. 1 and 2 shows one embodiment of a knee coil that includes a lower coil part 1 and an upper coil part 2. In a central region (e.g., the middle viewed from above) of the upper coil part 2, for example, four coil elements 3 are configured in a movable manner (e.g., relative to the remainder or rest of the housing 1, 2 and/or to the housing upper part 2 and/or to one another).

The movable parts 3 (e.g., each with one or more antennas in or on the movable part 3) are connected to the upper coil part 2 by way of a movable region 4. The movable region 4 may, for example, be an articulation (e.g., a rotary articulation). Alternatively, in the movable region 4, for example, a coil element (e.g., receive and/or transmit) may be sheathed with elastic coil material (e.g., polyethylene (PE) foam) that opens on at least one side of a bending region (e.g., a bendable region) at the flexible or rigid remainder of the coil housing 2 (e.g., the upper coil part) and/or is, for example, bonded, screwed, or clamped to the remainder of the coil housing 2.

The electrical connection between the coil elements and the rest of the local coil 106 (e.g., a controller, an amplifier or receive signal connections) is also passed through an articulation G or a pliable region 4, for example. This may be done, for example, using pliable lines, rotatable contacts or pliable printed circuit board material. Removable coil elements may have plug-type electrical contacts, for example, to connect the movable elements 3 electrically to the local coil 106.

The movable coil elements 3 may be positioned vertically (5), for example, for ankle recordings (e.g., as in FIG. 2). In the vertical position, the coil elements may be locked, for example, by latching, clamping, and/or other methods. Pliable elements may also be pushed upward and out directly by a foot of the patient.

A resulting opening O is as large as the foot of the patient, and the return force of the pliable material provides that the receive elements mold to the foot of the patient.

The erect movable elements 3 assist with imaging and thus extend the receive range of the local coil 106 in the direction of an end of the foot.

FIG. 4 shows how one embodiment of a wrist coil may be produced, for example, from a knee or head coil lower part 6 (e.g., shown in FIG. 3). The wrist coil may be produced, for example, using two, three (e.g., with cover) or more movable elements 8.

Movable elements 3 of a local coil 106, a local coil upper part 2 or a local coil lower part 1 may, for one deployment (e.g., as a foot coil according to FIG. 2), be folded out of the local coil 106 and, for another deployment (e.g., as a wrist coil 7 according to FIG. 4), may be folded into the local coil 106 (e.g., to support a wrist).

Local coils that may be used for a number of different deployments on different body parts (e.g., foot, knee, wrist) of the examination object may not always achieve the quality of a specific coil for a body part but may greatly increase flexibility.

By changing the position of some or all of the movable elements 3 (e.g., receive elements; as movable parts) of the local coil 6, additional application options result in new element position. The position of the receive elements 3 may be changed in relation to the remainder/rest of the housing (e.g., the upper part or lower part of the local coil 106). In the new position, the receive elements 3 may assist with imaging for an anatomically different body region. The capacity of the coil elements 3 for movement turns a knee coil (e.g., only intended for knee examinations), for example, into a local coil that is also suitable for ankle examinations. Changing the position of individual or several coil elements 3 of the local coil 106 serves not only to tailor the local coil 106 to a contour of the examination object 105 (e.g., the patient), but may also create a new additional area of application.

If the coil elements 3 of the local coil 106 are moved, for example, to see the position of the knee in the coil, the movable receive elements 3 may create a temporary viewing window.

Configuring individual or several receive elements 3 from the antenna unit (or array) of the local coil 106 as movable and using the receive elements 3 for imaging in the new position produces further deployment options with a corresponding configuration. For example, an element for mandibular joint examinations may be provided on a head coil in a movable manner so that the element for mandibular joint examination may be moved closer to the head of the patient (e.g., so that the element for mandibular joint examinations may be moved out of the head coil).

FIG. 5 shows one embodiment of an MRT local coil in cross section. A plurality of coil elements 3a, 3b, 3c (e.g., each coil element 3a, 3b, 3c of the plurality containing an antenna A) may be moved relative to the rest of the housing (e.g., in relation to the upper coil part 2) of the local coil 106 and are pivotable by way of rotary articulations G (e.g., the element 3c in the direction of the arrow P about the articulation G). Each of the rotary articulations G is fastened to a coil element 3a, 3b, 3c and to the rest of the housing (e.g., the upper coil part 2) of the local coil 106.

In the embodiment shown in FIG. 5, the coil elements 3a, 3b, 3c are integrated in the housing 2 of the local coil 106 such that the coil elements 3a, 3b, 3c do not project either outward or inward from a surface. Surfaces are roughly aligned with surfaces of the housing 2 of the local coil 106. Two opposing surfaces OSA, OSI of each of the coil elements 3a, 3b, 3c are located, for example, in a curved plane (e.g., with roughly circular cross section), in which a surface OGA, OGI of at least one part of the housing 1, 2 of the local coil 106 is also located (e.g., largely or completely).

All the abovementioned possible details of exemplary embodiments of MRT local coils may be of relevance to the present embodiments individually or in any combination.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil configured for a magnetic resonance tomography system that is operable in imaging at least an ankle, a foot, a head, a knee, and a wrist, the local coil comprising:
  a coil element comprising an antenna; and
  a housing;
    wherein the coil element is movable relative to the housing of the local coil between a first operable imaging position and a second operable imaging position;
    wherein a surface of the coil element and a surface of at least a part of the housing are together configured to form a substantially continuous surface in the first operable imaging position;
    wherein a movement of the coil element to the second operable imaging position breaks a continuity of the substantially continuous surface;
    wherein movement between the first operable imaging position and the second operable imaging position does not involve disassembly of the local coil;
    wherein the first operable imaging position and the second operable imaging position are independently configured for imaging different body regions of a patient; and
    wherein the local coil is operable to image at least one first body part of an ankle, a foot, the head, a knee, and a wrist of the patient in the first operable imaging position, and the local coil is operable to image at least one second body part of the ankle, the foot, the head, the knee, and the wrist of the patient in the second operable imaging position, the at least one first body part being different than the at least one second body part.

2. The local coil as claimed in claim 1, wherein the housing comprises an opening when the coil element is in a first position relative to the housing, and wherein the opening is not present when the coil element is in a second position relative to the housing.

3. The local coil as claimed in claim 1, wherein the surface of the coil element is located in either a flat or curved plane, in which the surface of at least the part of the housing is also located in the first operable imaging position.

4. The local coil as claimed in claim 1, wherein two opposing surfaces of the coil element are located in either a flat or curved plane, in which the surface of at least the part of the housing is also located in the first operable imaging position.

5. The local coil as claimed in claim 1, wherein the coil element is a segment of either an upper part or a lower part of the housing.

6. The local coil as claimed in claim 1, wherein the movable coil element is operable to produce an opening in the housing by moving the coil element relative to the housing.

7. The local coil as claimed in claim 1, wherein the movable coil element is operable to produce a through opening through the housing by moving the coil element relative to the housing.

8. The local coil as claimed in claim 1, comprising at least one other coil element that is movable relative to the housing.

9. The local coil as claimed in claim 1, wherein the coil element is fastened to the housing and is movable relative to the housing.

10. The local coil as claimed in claim 1, wherein the coil element is foldable relative to the housing using an articulation.

11. The local coil as claimed in claim 1, wherein the coil element is movable relative to the housing in at least a movable region, in which the coil element is connected to the housing, and wherein the movable region is in elastic coil material that is sheathing the antenna of the coil element.

12. The local coil as claimed in claim 1, wherein the coil element is positionable on and removable from the local coil.

13. The local coil as claimed in claim 1, wherein the coil element is bondable to and removable from the local coil.

14. The local coil as claimed in claim 1, wherein the coil element is pliable.

15. The local coil as claimed in claim 1, comprising at least one of the coil element, only some coil elements of the coil element and the at least one other coil element being movable relative to the housing, the movable coil elements operable to produce an opening in a structure formed by the housing, the coil element and the at least one other coil element.

16. The local coil as claimed in claim 15, wherein the opening is dimensioned such that a part of an examination object is introducible into or passable through the opening.

17. The local coil as claimed in claim 15, wherein the opening is producible in a part of the housing due to positions of the coil element and the at least one other coil element, respectively.

18. The local coil as claimed in claim 15, wherein the opening includes one region producible by movement of the coil element or includes a plurality of partial opening regions producible by movement of the coil element and the at least one other coil element.

19. The local coil as claimed in claim 1, wherein the coil element is movable relative to the rest of the local coil, the movable coil element being operable to produce an opening in the form of a recess cutout passing through just a part of a wall of the housing by moving the coil element relative to the housing.

20. The local coil as claimed in claim 15,
wherein the housing comprises a lower coil part and an upper coil part, and
wherein the coil element and the at least one other coil element are only present in the upper coil part of the housing.

21. The local coil as claimed in claim 1, wherein an electrical connection between the antenna of the coil element and the rest of the local coil is passed through either an articulation or a pliable region using at least pliable lines, rotatable contacts or pliable printed circuit board material.

22. The local coil as claimed in claim 1,
wherein the coil element is removable from the local coil, and
wherein the coil element has a plug-type electrical contact, the plug-type electrical contact being operable to establish an electrical connection between the coil element and the rest of the local coil.

23. The local coil as claimed in claim 1, wherein the movable coil element is lockable in a position that produces an opening by either latching with a latching device or by clamping with a clamping device.

24. The local coil as claimed in claim 2, wherein the opening, when present, within the housing, is as large as a foot of a patient.

25. The local coil as claimed in claim 2, wherein a return force of a pliable material in a region of the coil element brings about a molding of the movable coil element to a part of an examination object projecting into the opening.

26. The local coil as claimed in claim 2, wherein the coil element is moved away from the housing, the movement away from the housing producing the opening that is usable and configured for imaging in the first position.

27. The local coil as claimed in claim 8, wherein the local coil is transformable by the movement of the coil element and the at least one other coil element relative to the housing for different applications.

28. The local coil as claimed in claim 10, wherein the articulation is a rotary articulation connected to both the coil element and the housing.

* * * * *